United States Patent
Tang et al.

[11] Patent Number: 5,869,385
[45] Date of Patent: Feb. 9, 1999

[54] SELECTIVELY OXIDIZED FIELD OXIDE REGION

[75] Inventors: Yuan Tang, San Jose; Mark Ramsbey, Sunnyvale, both of Calif.

[73] Assignee: Advanced Micro Devices, Inc., Sunnyvale, Calif.

[21] Appl. No.: 569,704

[22] Filed: Dec. 8, 1995

[51] Int. Cl.$^6$ ................................................... H01L 21/76
[52] U.S. Cl. .................... 438/440; 438/439; 438/753; 438/964; 148/DIG. 138
[58] Field of Search .................... 438/439, 440, 438/753, 964; 148/DIG. 138

[56] References Cited

U.S. PATENT DOCUMENTS

| | | | |
|---|---|---|---|
| 4,098,618 | 7/1978 | Crowder et al. | 438/440 |
| 4,728,619 | 3/1988 | Pfiester et al. | 438/228 |
| 4,743,563 | 5/1988 | Pfiester et al. | 438/228 |
| 4,748,134 | 5/1988 | Holland et al. | 438/440 |
| 4,847,213 | 7/1989 | Pfiester | 438/228 |
| 4,954,459 | 9/1990 | Avanzino et al. . | |
| 5,151,381 | 9/1992 | Liu et al. . | |
| 5,358,894 | 10/1994 | Fazan et al. | 438/440 |
| 5,707,888 | 1/1998 | Aronowitz et al. | 438/443 |

FOREIGN PATENT DOCUMENTS

| | | |
|---|---|---|
| 59-104140 | 6/1984 | Japan . |
| 60-101947 | 6/1985 | Japan . |
| 63-280438 | 11/1988 | Japan . |
| 64-744 | 1/1989 | Japan . |

OTHER PUBLICATIONS

S.B. Felch et al., "Characterization of a Plasma Doping System," Proceedings of the Ninth International Conference on Ion Implantation Technology, Sep. 20–24, 1992.

P.G. Carey et al., "Fabrication of Submicrometer MOSFET's Using Gas Immersion Laser Doping (GILD)," IEEE Electron Device Letters, vol. EDL–7, No. 7, Jul. 1986, p. 440.

Primary Examiner—Trung Dang

[57] ABSTRACT

A field oxide region is formed with a reduced bird's beak by selectively implanting impurity atoms into the semiconductor substrate to increase the oxidation rate of the substrate and thermally oxidizing the implanted region of the semiconductor substrate. In another embodiment, a gate oxide layer having a differential thickness is formed by implanting impurity atoms into the semiconductor substrate in a selected region wherein a thick portion of the gate oxide is to be formed and thermally oxidizing the semiconductor substrate.

9 Claims, 4 Drawing Sheets

SELECTIVELY OXIDIZED FIELD OXIDE REGION

TECHNICAL FIELD

The present invention relates to a semiconductor device comprising a field dielectric region, and to a method of manufacturing such a device. The invention has particular applicability for VLSI (Very Large Scale Integration) and higher density semiconductor devices.

BACKGROUND ART

Conventional semiconductor devices comprise a substrate and various electrically isolated regions, or so called active regions, in which individual circuit components are formed. Conventionally, the electrical isolation of these active regions is accomplished by the thermal oxidation of the semiconductor substrate, typically silicon, bounding the active regions. The conventional method for forming a field oxide comprises growing or depositing an oxide layer on the semiconductor substrate surface and depositing a nitride layer thereon. The oxide and nitride layers are patterned and etched employing conventional photolithography techniques to form a masking layer having openings extending down to and exposing the semiconductor substrate. The openings define areas on the surface of the semiconductor substrate in which field oxide regions are subsequently formed. These exposed regions are commonly referred to as the "field." The field oxide regions are formed by heating the semiconductor substrate with the field regions exposed to an oxidizing gas such as oxygen, i.e., a technique known as Local Oxidation of Silicon (LOCOS). Often, an ion implantation step is performed prior to the oxidation to ensure the proper functioning of the individually isolated circuit elements in the active regions.

Following the oxidation, the masking layers are removed by some combination of chemical and/or physical etching. A typical resulting prior art structure is shown in FIG. 1, wherein there is depicted a typical field oxide region 10 formed in the surface of a semiconductor substrate 1.

As can be observed in FIG. 1, either edge of the field oxide tapers in its vertical dimension both above and below the original surface of the semiconductor. This tapering end portion resembles and, therefore, is commonly referred to as, a "bird's beak." The bird's beak is formed during the thermal oxidation of the field regions because the oxygen which diffuses vertically into the substrate in the open areas also diffuses horizontally once it has penetrated the substrate. See, for example, Liu et al., U.S. Pat. No. 5,151,381 and Avanzino et al., U.S. Pat. No. 4,954,459.

This process has several inherent problems. For example, while the horizontal extent of the bird's beak can be loosely controlled by the stress induced in the masking layers adjacent to the field, this same stress can cause strain defects in the active areas including point defects, dislocations, stacking faults, as well as catastrophic failures such as delamination, particle generation, etc.

As shown in FIG. 1, the bird's beak region narrows the active region of the substrate between the field oxide regions in which active devices can be constructed down to a width X, with the width of the mask W minus X representing the area of lateral encroachment of the growth oxide. Typically, the degree of lateral encroachment of field oxide region 10 is no less than about $$\frac{W-X}{2}$$

which normally corresponds to $$\frac{T}{2}.$$

To remedy this problem, the dimensions of the mask must be altered to accommodate encroachment, i.e., the openings for the field oxide region must be made smaller. However, reduction in the size of mask openings becomes a serious problem as the density of integrated circuit structures increases. Thus, as the dimensions of conductive lines and interwiring spaces are reduced into the submicron range, such as less than about 0.5 microns, even less than 0.25 microns, accuracy and, hence, manufacturability, are reduced. Further encroachment occurs upon lateral migration of the field implant, i.e., the doping beneath the field oxide, with the field oxide region during growth, thereby further reducing the active device region.

As disclosed in U.S. Pat. No. 4,954,459, the problems associated with growing a field oxide region in an integrated circuit have been recognized and addressed in different ways, such as utilizing a photoresist layer to etch a groove which is filled in with a deposited oxide before removing the photoresist mask. Another prior art technique reported in U.S. Pat. No. 4,954,459 comprises forming an isolation oxide by refilling anisotropically etched recesses in the silicon substrate with deposited oxide.

The inventive method disclosed in U.S. Pat. No. 4,954,459 comprises the use of a mechanically polishable planarization layer, such as a polysilicon layer, which is applied over an oxide layer and then polished down to the highest level of the oxide. The exposed oxide is then etched down to a predetermined level above the underlying integrated circuit structure after which the remaining polysilicon is removed by a further polishing step. The oxide may then be etched down to the level of the highest portions of the underlying integrated circuit structure.

Another type of isolation structure, distinct from a field oxide region, is known as trench isolation. A trench isolation structure is quite distinct from a field oxide region in that it is typically formed by etching a trench in the silicon substrate, normally about 0.30–0.50 microns deep, conducting a thermal oxidation step to grow an oxide layer on the trench walls to control the silicon-silicon dioxide interface quality, and refilling the trench with an insulator. The surface is then planarized to complete the trench isolation structure. Such a trench isolation structure disadvantageously requires complex processing steps and costly equipment.

In U.S. patent application Ser. No. 08/571,053 (filed on Dec. 12,1995), a technique is disclosed for forming a field dielectric region which avoids thermal oxidation. The disclosed method comprises introducing dielectric forming ions into the exposed portion of the semiconductor substrate, which dielectric forming ions combine with the substrate, typically silicon, to form a field dielectric region exhibiting a significantly reduced bird's beak and reduced bulging above the surface of the semiconductor substrate without thermal oxidation.

There are various types of semiconductor devices, such as electrically programmable semiconductor devices wherein a gate oxide is provided between the semiconductor substrate and a floating gate electrode. In such type semiconductor devices a section of the gate oxide typically exhibits a greater thickness in one section than in a different section, as in an adjoining section. For example, in FIG. 2 there is depicted a conventional prior art electrically erasable programmable read only memory (EEPROM) semiconductor device comprising substrate 20, source region 21, drain region 22, field oxide 23, gate oxide 24, floating gate 26, dielectric layer 28 and control gate 27. A portion of gate oxide layer 24 has a section of reduced thickness 25. It is difficult to form a gate oxide layer having sections with differential thicknesses.

There exists a need for a relatively simple, accurate, efficient and cost effective technique for forming a thermally oxidized field oxide region which, as formed, exhibits a substantially reduced bird's beak, thereby enabling the obtainment of minimal design features and spacings and, hence, high densification and integration. There also exists a need for a relatively simple, accurate, efficient and cost-effective technique for forming a gate oxide film having sections of different thicknesses.

DISCLOSURE OF THE INVENTION

An object of the present invention is a semiconductor device having a thermally oxidized field region with a substantially reduced bird's beak.

Another object of the invention is a semiconductor device having a gate oxide layer with sections of different thicknesses.

A further object of the invention is a method of manufacturing a semiconductor device having a thermally oxidized field oxide region with a substantially reduced bird's beak.

Another object of the present invention is a method of manufacturing a semiconductor device having a gate oxide film with sections of different thicknesses.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a semiconductor substrate; an active region formed in the substrate; and a thermally oxidized field oxide region, having a maximum thickness, adjoining the active region; wherein the field oxide region, as formed, contains a bird's beak extending in a lateral direction a distance less than about 22.5% of the maximum thickness.

A further aspect of the present invention is a semiconductor device comprising: a semiconductor substrate; an active region formed in the substrate; and a field oxide region formed in the substrate adjoining the active region; wherein the field oxide region is formed by roughening the surface and/or causing crystal damage in a selected region of the substrate in an amount sufficient to increase the thermal oxidation rate of the substrate by at least about 10%; and thermally oxidizing the selected region of the substrate.

Another aspect of the invention is a semiconductor device comprising: a semiconductor substrate; a gate oxide layer having at least one section with a thickness greater than a thickness of another section; wherein the section with the greater thickness comprises implanted impurity atoms.

A further aspect of the present invention is a semiconductor device comprising: a semiconductor substrate; and a gate oxide layer having a section with a thickness greater than the thickness of another section; wherein the gate oxide layer is formed by selectively roughening the surface and/or inducing crystal damage in a section of the substrate wherein the thicker section of the gate oxide layer is to be grown; and thermally oxidizing the substrate.

Another object of the present invention is a method of manufacturing a semiconductor device comprising a field oxide region, which method comprises: forming a patterned layer on an upper surface of a semiconductor substrate, which patterned layer has an opening extending through and exposing the upper surface of the semiconductor substrate; roughening and/or inducing crystal damage in the exposed portion of the semiconductor substrate in an amount to increase the thermal oxidation rate of the exposed portion by at least about 10%; and thermally oxidizing the substrate to form the field oxide region.

A further aspect of the present invention is a method of manufacturing a semiconductor device comprising: a gate oxide having a section with a thickness greater than the thickness of another section, which method comprises: forming a patterned layer on an upper surface of the semiconductor substrate, which patterned layer has an opening extending to and exposing the upper surface of the semiconductor substrate in a region wherein the section of the gate oxide having a greater thickness is to be formed; roughening and/or inducing crystal damage in the exposed portion of the semiconductor substrate; removing the patterned layer; and thermally oxidizing the semiconductor substrate to form the gate oxide layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
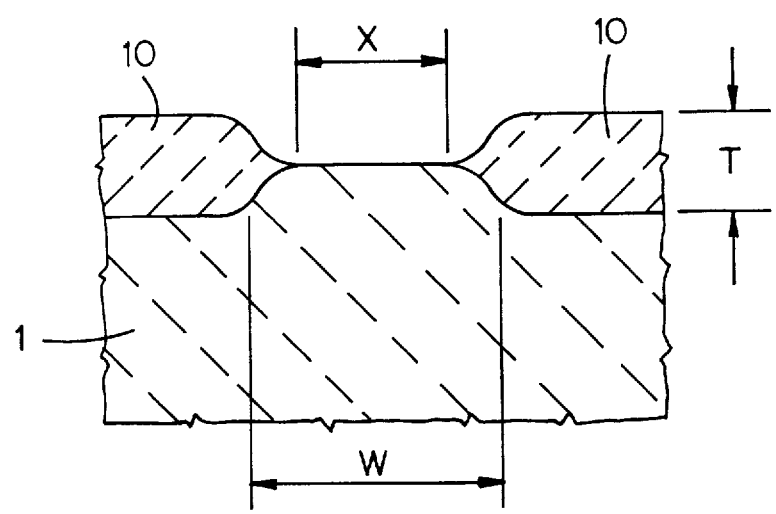
FIG. 1 schematically depicts a prior art field oxide region.

The present invention addresses and solves known problems attendant upon conventional LOCOS techniques for forming a thermally oxidized field oxide region in a semiconductor substrate. Conventional LOCOS techniques for forming a field oxide region necessarily generate a bird's beak which, due to the degree of lateral encroachment into an active region, renders it difficult to obtain submicron dimension patterns by conventional photolithographic and etching techniques, particularly dimensions less than 0.25 microns. Conventional thermally oxidized field oxide regions exhibit a bird's beak which extend in a lateral direction a distance of about 50% of the maximum thickness of the field oxide region. The present invention addresses and solves the lateral encroachment problem with a simplified, efficient, accurate and cost-effective technique.

In accordance with the present invention, a thermally oxidized field oxide region is formed with a significantly reduced bird's beak, thereby reducing lateral encroachment into an active region of the semiconductor substrate and, hence, enabling higher densification. The present invention enables the formation of a thermally oxidized field oxide region having a bird's beak which is significantly reduced, in terms of lateral growth, vis-à-vis the bird's beak of a conventionally formed thermally oxidized field oxide region. The present invention enables the formation of a thermally oxidized field oxide region having a bird's beak extending in a lateral direction a distance less than about 22.5% of the maximum thickness of the field oxide region so that the total encroachment of an active region is less than 45% vis-à-vis an encroachment of about 50% as in the case of conventionally formed field oxide regions. In accordance with the present invention, a thermally oxidized field oxide region can be formed with a bird's beak extending in a lateral direction a distance even less than about 15% of the maximum thickness of the field oxide region. In a preferred embodiment, the present invention comprises a semiconductor device having a thermally oxidized field oxide region with a bird's beak extending in a lateral direction a distance no greater than about 10% of the maximum thickness.

In accordance with the present invention, a field oxide region is formed with a substantially reduced bird's beak by causing damage to the crystal structure of the semiconductor substrate, typically a silicon substrate. Damage to the crystal structure of the semiconductor substrate in accordance with the present invention can be induced by various techniques, such as atom implantation and plasma ion etching. A preferred embodiment in accordance with the present invention comprises the use of atom implantation to induce crystal damage in a semiconductor substrate to increase the oxidation rate of the damaged substrate. It has been observed that the oxidation rate of silicon is enhanced by causing crystalline damage. In accordance with the present invention, the resulting increased oxidation rate is utilized to reduce the lateral extension of a bird's beak upon formation of a thermally oxidized field oxide region in the surface of silicon substrate.

In another embodiment of the present invention, the surface of the semiconductor substrate is roughened in order to increase the oxidation rate. In a preferred aspect of this embodiment, the surface of the semiconductor substrate is roughened by wet etching.

In a preferred method according to the present invention, a masking layer is deposited on a semiconductor substrate, typically a silicon substrate. The masking layer is patterned by conventional photolithographic and/or etching techniques to form a mask pattern comprising a hole therethrough exposing the upper surface of the semiconductor substrate. The exposed surface of the semiconductor substrate is then roughened and/or the crystal structure of the exposed semiconductor substrate is damaged. Preferably, impurity atoms are introduced into the exposed portion of the semiconductor substrate. Substantially no impurity atoms are introduced into the masked portion of the semiconductor substrates which constitute future active regions.

Subsequently, as in a conventional LOCOS process, thermal oxidization is conducted to form the field oxide region with a significantly reduced bird's beak. The significant reduction in the lateral extension of the bird's beak of a field oxide region formed in accordance with the present invention vis-à-vis conventional LOCOS and modified LOCOS techniques stems from the introduction of impurity atoms into the silicon substrate, thereby causing crystalline damage. It is believed that such atom implantation and resulting damage to the crystal structure of the silicon substrate increases the oxidation rate of the silicon substrate in the areas in the atom implanted areas. The exact mechanism by which the oxidation rate of the impurity implanted and damaged silicon substrate is increased is not known. While not wishing to be bound by any particular theory, it is believed that such atom implantation enhances oxygen diffusion into silicon, thereby accelerating the oxidization rate in the atom implanted area. It is further believed that surface roughening of the semiconductor substrate increases the exposed surface area, thereby increasing the oxidation rate.

Thus, in accordance with a preferred embodiment of the present invention, the oxidization rate of the atom implanted silicon substrate is increased, thereby reducing the time required to form the thermally oxidized field oxide region. Since the field oxide region is formed in a shorter period of time, there is less lateral diffusion or growth of a bird's beak and, hence, the lateral extension of the bird's beak parallel to the silicon surface is reduced vis-à-vis conventional LOCOS and modified LOCOS techniques. The present invention, therefore, involves the selectively enhanced oxidization of the field oxide region.

The preferred embodiment of the present invention comprises the implantation of impurity atoms into a silicon substrate in an amount sufficient to significantly increase the oxidization rate and, hence, shorten the time required for formation of the field oxide region, thereby reducing the lateral extension of the bird's beak parallel to the surface of the semiconductor substrate. Thus, the present invention encompasses surface roughening of the semiconductor substrate and/or inducing damage to the semiconductor substrate, preferably by implanting impurity atoms, to achieve at least a 10% increase in the oxidization rate of the semiconductor substrate. It has been found that the oxidization rate can be accelerated by up to about 30%, preferably about 40%, most preferably about 50% by implantation of impurity atoms.

The concentration of implanted atoms and implantation conditions in accordance with the preferred embodiment are parameters which one having ordinary skill in the art could easily optimize in a particular situation given the disclosed objective of selectively increasing the oxidization rate of the silicon substrate in the field oxide region. It has been found that atom implantation at a concentration in excess of $1 \times 10^4$ atoms/cm$^2$ is generally sufficient to increase the oxidization rate of the silicon substrate in an amount sufficient to achieve a meaningful reduction in the lateral extension of the bird's beak. It has also been found that an impurity atom concentration in excess of about $1 \times 10^{17}$ atoms/cm$^2$ can be employed; however, the incremental benefit is outweighed by the amount of time required. Preferably, impurity atom concentration of about $1 \times 10^{14}$ to $1 \times 10^{16}$, most preferably $5 \times 10^{14}$ to $5 \times 10^{15}$ atoms/cm$^2$ is employed.

Preferably, the implanted impurity atoms are non-electrically conducting, such as silicon, germanium and argon. However, electrically conducting impurity atoms, such as phosphorus, boron and arsenic can also be employed. The impurity atoms can be introduced into a designated area of the surface of a semiconductor substrate by any of various conventional techniques, such as implantation techniques. During atom implantation, a minor degree of deflection may occur leading to what is known in the art as lateral straggling, i.e., a tendency for implanted atoms to extend laterally and under a masking area without the designated area for implantation. However, such lateral straggling can be minimized by conventional techniques, such as angled implant.

Impurity atoms can also be introduced by plasma immersion techniques, such as that disclosed by S. B. Felch et al., "Characterization of a plasma doping system," *Proceedings of the Ninth International Conference on Ion Implantation Technology*, Sep. 20–24, 1992. For example, a boron trifluoride ($BF_3$) plasma is generated with a bias of up to about 5 kV to implant boron ions in the substrate. A pulse negative voltage of about 1 to about 10 kV is applied to the substrate, causing the dopant ions to be accelerated towards the silicon substrate and implanted below the surface. Basically, plasma doping differs from conventional ion implantation in that the wafer is placed directly in the plasma source and the accelerating bias is applied to the wafer. A plasma doping system is available from Varian Corporation.

In addition, impurity atoms can be introduced by gas immersion laser techniques, such as that disclosed by P. G. Carey et al., "Fabrication of Submicrometer MOSFET's Using Gas Immersion Laser Doping (GILD)," *IEEE Electron Device Letters*, Vol. EDL-7, No. 7, July 1986, page 440. Basically, gas immersion laser doping involves pulsing a laser causing the surface of a semiconductor substrate to melt and a dopant species, which occupies the ambient, to dissociate and diffuse into the molten source. Diffusion in molten silicon of a dopant is quite rapid. The concentration can be controlled by the number of incident laser pulses, and the depth by the energy fluence.

As used throughout this disclosure including the specification and claims, the expression "as formed" refers to the field oxide region as it exists upon thermal oxidation without any subsequent etching or planarization treatment to alter its size or shape. The expression "as formed" does not include deposition of a dielectric material, such as an oxide. The as formed field oxide region in accordance with the present invention is formed with considerably reduced encroachment of adjoining active regions and, hence, submicron design features, such as less than about 0.25 microns, are obtained accurately and efficiently. Thus, the present invention dramatically minimizes reduction in the size of the active regions, thereby enabling the obtainment of submicron design features and, hence very high integration.

Subsequent to the formation of the field oxide region in accordance with the present invention, the patterned masking layer is removed and active regions are formed in the surface of the semiconductor substrate adjoining the field dielectric region in a conventional manner.

Figure 3:
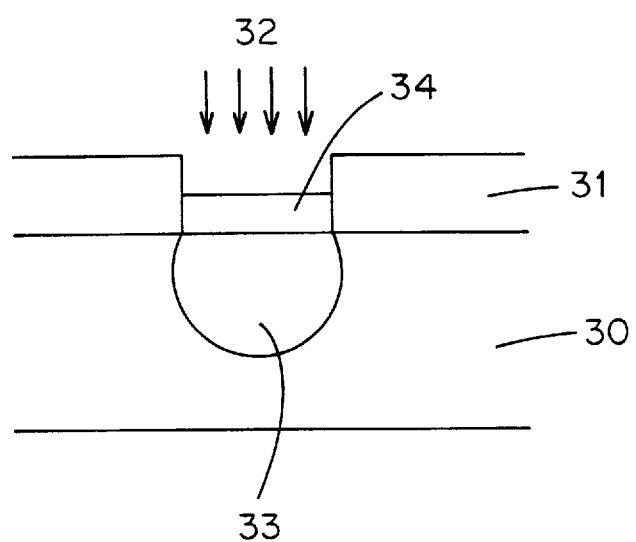
FIG. 3 schematically depicts a stage in the formation of a field oxide region in accordance with the present invention.

A preferred embodiment of the present invention is schematically illustrated in FIG. 3 wherein a patterned layer 31 is formed on semiconductor substrate 30. Patterned layer 31 typically comprises an oxide layer on which a nitride layer is preferably provided to prevent oxidation of the semiconductor substrate in which the active regions are formed. An opening is provided in patterned layer 31 exposing an upper surface of semiconductor substrate 30. Impurity atom implantation is then conducted as shown by arrows 32 to implant impurity atoms and cause internal damage to silicon substrate 30 in a region 33. Subsequently, thermal oxidation is conducted, whereby the damaged, atom implanted area 33 of the semiconductor substrate oxidizes at a significantly higher rate than the masked portions of the substrate and, consequently, the time required for formation of a field oxide region is reduced thereby reducing the time available for lateral extension of the bird's beak. Thus, a relatively accurate field oxide region 34 can be formed.

Figure 4:
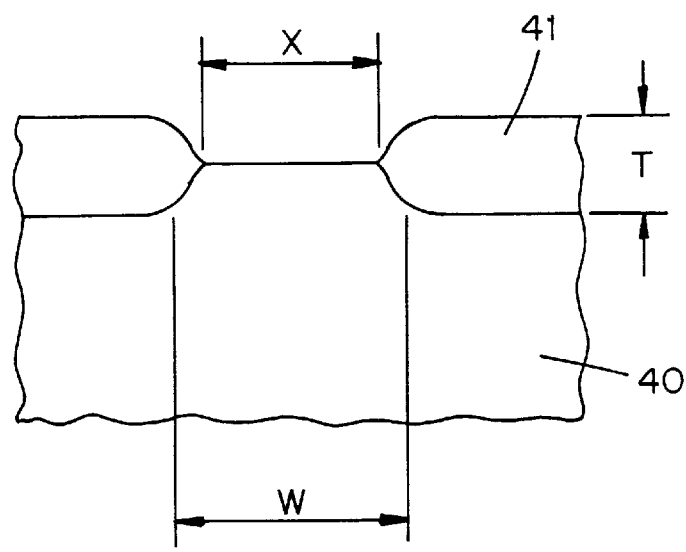
FIG. 4 schematically depicts a field oxide region formed in accordance with the present invention.

As shown in FIG. 4, in accordance with the present invention, field oxide region 41 is formed on semiconductor substrate 40 with a considerably reduced bird's beak vis-à-vis conventional practices as shown in FIG. 1. A conventionally thermally oxidized field oxide region contains a bird's beak extending in a lateral direction at a distance of about 25% of the maximum thickness, resulting in a total encroachment of an active region of 50% of the maximum thickness. However, the bird's beak of the thermally oxidized field oxide region formed in accordance with the present invention extends in a lateral direction less than about 22.5% of the maximum thickness of the field oxide region, preferably less than about 15%, most preferably not greater than 10% of the maximum thickness.

Figure 2:
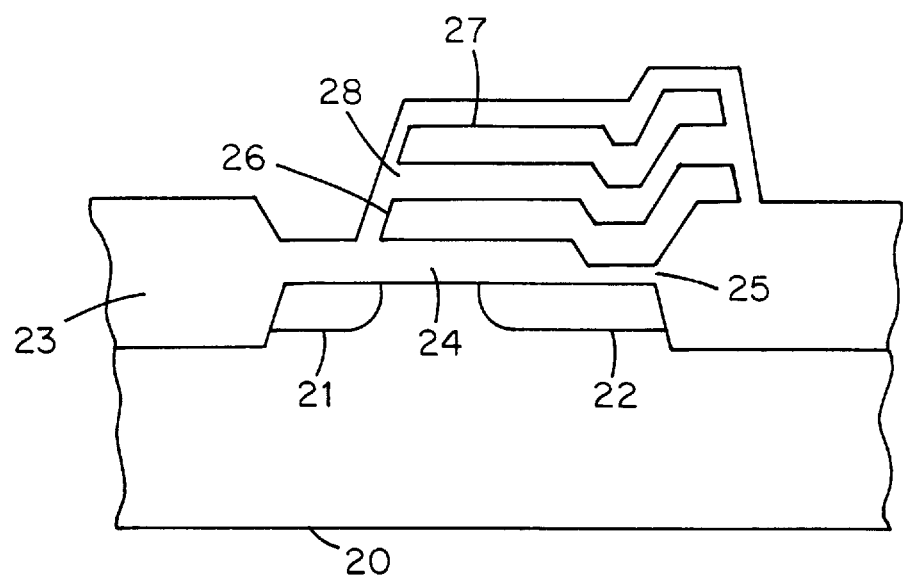
FIG. 2 schematically depicts a prior art EEPROM.

The present invention involving the selective oxidation of a substrate to enhance oxidation thereof is not confined to the formation of a field oxide region. Rather, the selective oxidation of a semiconductor substrate or a polysilicon layer at an increased oxidation rate enjoys utility in various other aspects and stages semiconductor processing. For example, the electrically programmable device depicted in FIG. 2 containing a gate oxide with sections of differential thickness can be conveniently formed in accordance with the present technique by roughening the underlying substrate or by inducing damage to the crystal structure, preferably by implanting impurity atoms, in the underlying substrate in a selected area in which the thicker portion of the gate oxide is to be formed. As in forming the field oxide region, the impurity atoms can be non-electrically conductive, such as silicon, germanium and argon, or electrically conductive. The concentration of implanted impurity atoms and implantation conditions can easily be optimized in a particular situation given the disclosed objective of increasing the oxidation rate of the atom implanted region. For example, it has been found that impurity atoms can be implanted at a concentration of about $1 \times 10^{14}$ atoms/$cm^2$ to achieve an advantageous increase in the oxidation rate, preferably up to about $1 \times 10^{17}$ atoms/$cm^2$, most preferably between $5 \times 10^{14}$ to $5 \times 10^{15}$ atoms/$cm^2$.

The materials and processing techniques, such as deposition, photolithographic, and etching techniques, employed in the present invention are those typically employed in manufacturing conventional semiconductor devices and, hence, are not set forth herein detail. The nitride layer masking layer is typically silicon nitride and is formed in accordance with conventional techniques for forming a nitride masking layer in the formation of a field oxide region by LOCOS. The semiconductor substrate can comprise a P-doped or N-doped silicon, preferably P-doped silicon, as with boron.

In accordance with the present invention a thermally oxidized field oxide region is formed by roughening the surface of the semiconductor substrate and/or inducing damage to the crystal structure, preferably by introducing impurity atoms into a semiconductor substrate, thereby increasing the oxidation rate of the surface roughened and/or damaged region. By increasing the oxidation rate, the time required for thermally oxidizing the substrate to form the field oxide region is reduced, thereby significantly reducing the lateral extension of the bird's beak and enabling the production of semiconductor devices having submicron design features and, hence, high integration and densification. In another preferred embodiment of the present invention, impurity atoms are selectively introduced into a portion of a substrate in an area where a gate oxide film is formed having a thicker section than other sections of the gate oxide film, such as in forming electrically programmable semiconductor device.

Although the present applicable to various types of semiconductor devices, it enjoys particular utility in semiconductor devices having minimal submicron design features and interwiring spacings, thereby enabling high integration and densification. The present invention is, therefore, applicable to any of various types of semiconductor devices, including C-MOS technology and electrically programmable devices.

Only the preferred embodiment of the invention and but a few examples of its versatility are shown and described in the present invention. It is to be understood that the invention is capable of use in various other combinations and environments and is capable of changes or modifications within the scope of the inventive concept as expressed herein.

We claim:

1. A method of manufacturing a semiconductor device comprising a field oxide region, which method comprises:

forming a patterned layer on an upper surface of a semiconductor substrate, which patterned layer has an opening extending through and exposing the upper surface of the semiconductor substrate;

roughening and inducing crystal damage in the exposed portion of the semiconductor substrate in an amount sufficient to increase the thermal oxidation rate of the exposed portion by at least about 10%; and thermally oxidizing the substrate to form the field oxide region.

2. The method according to claim 1, comprising inducing crystal damage in the exposed portion of the semiconductor substrate by implanting impurity atoms therein.

3. The method according to claim 2, wherein the implanted impurity atoms are nonelectrically conductive.

4. The method according to claim 3, wherein the nonelectrically conductive impurity atoms are selected from the group consisting of silicon, germanium and argon.

5. The method according to claim 2, wherein the implanted impurity atoms are electrically conductive.

6. The method according to claim 2, comprising implanting impurity atoms at a concentration in excess of about $1 \times 10^{14}$ atoms/cm$^2$.

7. The method according to claim 6, comprising implanting impurity atoms at a concentration ranging up to about $1 \times 10^{17}$ atoms/cm$^2$.

8. The method according to claim 7, comprising implanting impurity atoms at a concentration of about $5 \times 10^{14}$ to about $5 \times 10^{15}$ atoms/cm$^2$.

9. The method according to claim 1, comprising roughening the exposed portion of the semiconductor substrate by chemical etching.

* * * * *